US006832327B1

(12) United States Patent
Magro et al.

(10) Patent No.: US 6,832,327 B1
(45) Date of Patent: Dec. 14, 2004

(54) APPARATUS AND METHOD FOR PROVIDING AN EXTERNAL CLOCK FROM A CIRCUIT IN SLEEP MODE IN A PROCESSOR-BASED SYSTEM

(75) Inventors: James R. Magro, Austin, TX (US); Michael S. Quimby, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 524 days.

(21) Appl. No.: 09/969,304

(22) Filed: Oct. 2, 2001

(51) Int. Cl.[7] .................................................. G06F 1/04
(52) U.S. Cl. ...................... 713/500; 713/300; 713/320; 714/731; 327/298; 327/407
(58) Field of Search ................................. 713/500, 320, 713/300; 327/407, 298; 714/731

(56) References Cited

U.S. PATENT DOCUMENTS

| 5,592,173 A | * | 1/1997 | Lau et al. ............... 342/357.12 |
| 5,615,376 A | * | 3/1997 | Ranganathan ............... 713/322 |
| 5,881,016 A | * | 3/1999 | Kenkare et al. ........ 365/230.03 |
| 5,925,135 A | * | 7/1999 | Trieu et al. .................. 713/400 |
| 5,941,990 A | * | 8/1999 | Hiiragizawa ................ 713/310 |
| 6,101,144 A | * | 8/2000 | Jo .............................. 365/229 |
| 6,266,294 B1 | * | 7/2001 | Yada et al. .................. 365/233 |
| 6,396,324 B1 | * | 5/2002 | Hsu et al. .................... 327/298 |
| 6,504,402 B2 |   | 1/2003 | Horiguchi et al. |
| 6,552,596 B2 | * | 4/2003 | Cowles et al. ............... 327/318 |
| 6,584,571 B1 |   | 6/2003 | Fung |
| 6,586,911 B1 |   | 7/2003 | Smith et al. |
| 6,650,594 B1 | * | 11/2003 | Lee et al. ..................... 365/233 |
| 6,665,232 B2 | * | 12/2003 | Van De Graaff ............ 365/233 |
| 6,704,892 B1 | * | 3/2004 | Kurd et al. .................. 714/724 |

OTHER PUBLICATIONS

U.S. Appl. No. 09/969,302, filed Oct. 2, 2001.
U.S. Appl. No. 09/969,300, filed Oct. 2, 2001.
"DDR SDRAM Functionality (and Controller Read Data Capture)", *Micro Design Line*, vol. 8, Issue 3, Third Quarter, 1999, Micron Technology, Inc., Boise, Idaho.

* cited by examiner

Primary Examiner—Rehana Perveen
(74) Attorney, Agent, or Firm—Meyertons Hood Kivlin Kowert & Goetzel, P.C.; B. Noël Kivlin

(57) ABSTRACT

A processor-based system such as a workstation or server, using a system clock provided through a phase-locked loop (PLL) to a clock gate and then to a clock tree, which distributes the core system clock to components in the processor-based system, including a host bridge circuit. The host bridge distributes control signals to a receiving device such as a memory module, which may use a continued clocking signal when the system enters a low-power mode. A feedback clock for the PLL is provided to the receiving devices during low-power mode to ensure continued clocking, when the clock gate output is low and the clock tree is thereby disabled. A skew compensation circuit coordinates clocking in the continued clock and the core system clock.

21 Claims, 3 Drawing Sheets

APPARATUS AND METHOD FOR PROVIDING AN EXTERNAL CLOCK FROM A CIRCUIT IN SLEEP MODE IN A PROCESSOR-BASED SYSTEM

BACKGROUND OF THE INVENTION

It has become more important in recent years that processor-based systems (such as workstations and servers) feature power-down or sleep (low-power) modes, to save the power that would otherwise be driving the system even when at least some subsystems may not be in use. For instance, it is economical to power down a local device control system in a computer system that is not actively in use.

However, in certain systems it may be undesirable to enter a low-power mode for the entire device control system, since some of the devices may require continued clocking to maintain the integrity of their data or state. A recently developed example is double-data rate (DDR) memory modules such as DIMMs (double in-line memory modules), which can benefit by continued clock generation even when their associated circuits in the computer system (such as the memory controller and other local device control circuitry) are in a low-power mode.

It is therefore desirable to arrive at a system that allows such devices as DDR DIMMs to continue to receive a clock signal and remain in an active state even when the circuitry that drives such devices is itself in a powered-down or sleep mode.

SUMMARY OF THE INVENTION

In order to continue the clocking of a device such as a DDR DIMM when a portion of a computer system enters an energy-saving mode, wherein the usual core clock signal is inhibited, a system according one embodiment of the invention includes a clock bypass circuit providing bypass clock signals. The computer system may typically include a phase-locked loop (PLL) circuit that receives the core clock as input, and outputs a phase-locked core clock, which is then provided to a clock tree for distribution to components of the computer system.

To implement an energy saving (low-power) mode, a clock gate is provided at the input end of the clock tree, and the gate blocks passage of the (phase-locked) core clock when the low-power mode is desired.

The bypass clock signals do not, however, pass through the clock gate, and instead, are provided as input to the memory modules or other devices that are to continue operating even during low-power mode. In this way, refresh or reset operations are avoided for such memory modules or other devices, with their resultant refresh time periods and possible signal or data corruption during a reset procedure.

In one embodiment of the invention, the bypass clock signals are passed through a skew compensation circuit, which is clocked by a double-frequency (2x) clock from the PLL circuit. The skew compensation circuit realigns the bypass clock signal with the 2x clock signal, if any skew has taken place. In addition, control signals are similarly aligned with the 2x clock signal by another circuit, so that the bypass clock signals and the control signals are substantially coordinated.

For DDR DIMMs, the bypass clock signal is additionally converted into a differential clock signal by a the skew compensation circuit, for more reliable, noise-free clock signals.

Since conventional PLL circuits use feedback clock signals, the bypass clock signals can be derived from the PLL feedback clock signals. A delay-matching circuit may be used in the feedback clock circuit to compensate for path delays introduced by the clock tree circuit.

DESCRIPTION OF THE PREFERRED EMBODIMENTS

Figure 1:
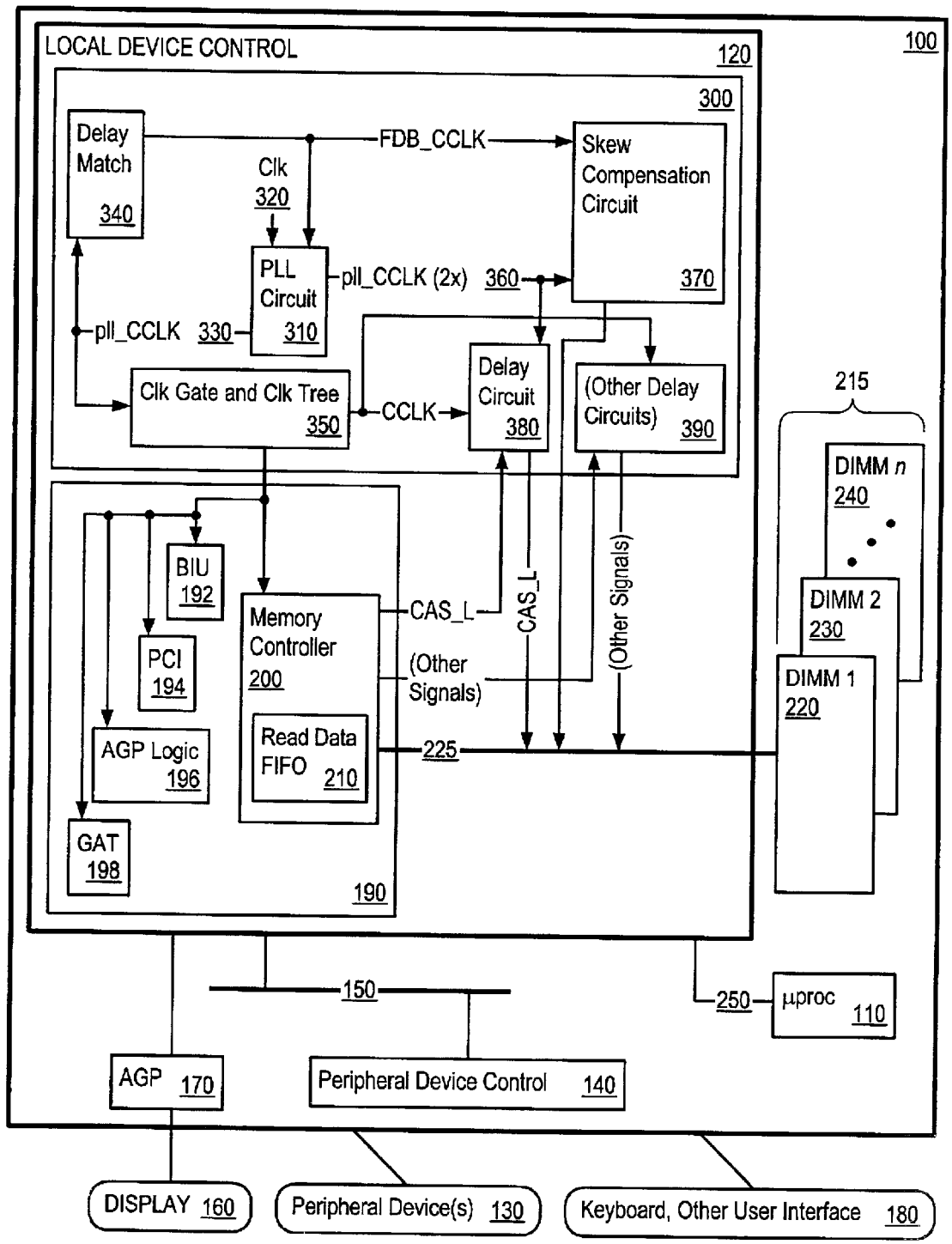
FIG. 1 is a block diagram of a processor-based systems incorporating features of the invention.

The block diagram of FIG. 1 shows a processor-based system 100, which may be a workstation, server, personal computer or other system. The system 100 is controlled by one or more processors such as processor 110, which governs the operation of local devices by a local device control circuit 120 (also known as a host bridge). In particular, the circuit 120 includes circuitry that controls data and command exchanges with local devices. The processor 110 operates using commands, program modules and the like that are conventionally stored in memory in a conventional fashion.

Processor 110 also governs the operations of peripheral devices 130 via a peripheral device control circuit 140 coupled to the host bridge 120 via a peripheral control bus 150. The circuit 140 includes logic (i.e. hardware and/or software) and circuitry to control disk drives, e.g. DMA (direct memory access) engines, serial ports, storage units or servers, and so on.

A conventional display 160 is controlled by the host bridge 120 via an AGP (accelerated graphics port) 170, and user interface is provided via a keyboard, mouse, track ball or other user interface devices 180. Other conventional local devices 190—such as bus interface unit (BIU) 192, a PCI host bridge circuit 194, AGP logic 196, a graphics adapter table (GAT) 198, and so on—are also included in the system 100.

The host bridge 120 includes a memory controller 200 including a read data FIFO 210, which in respects other than those discussed herein may be of conventional design.

The host bridge 120 also includes circuitry that controls data and command exchanges with memory modules 215, which in a typical system will include multiple DIMMs such as DIMMs 1–n (reference numerals 220–240) and/or other suitable memory modules or media, coupled to the host bridge 120 (and memory controller 200) via a memory bus 225. One or multiple memory modules may be used, depending upon the configuration of the system 100.

The host bridge 120 may in many respects include conventional or known circuitry (with the addition of the inventive features described below), but may in particular incorporate features of the system controller (e.g., the "Northbridge", such as the AMD-761™ uniprocessor controller or the 762™ dual processor controller) circuits of Advanced Micro Devices, Inc. (AMD). The peripheral device control circuit 140 may likewise in most respects be conventional or known circuitry, but may incorporate features of AMD's peripheral bus controllers (e.g., the "Southbridge" or AMD-766™ controller).

In the case of an AMD system, the processor(s) may be one or more AMD-K7™ processors connected to one another by one or more system buses, and connected to the host bridge 120 via one or more buses 250. Bus 250 may be AMD's S2K™ bus, which is a widely known and used bus. Other processors and buses are usable in this setting.

An embodiment of a system according to the invention includes a clock circuit 300, which includes a PLL (phase-locked loop) circuit 310 coupled to a system clock 320. In current systems, the system clock 320 may have, for instance, a frequency of 100 or 133 MHz.

The PLL circuit 310 stabilizes the input core clock signal 320 over PVT (process-voltage-temperature) and other environmental variables in a conventional manner, and passes the core clock 320 out as a phase-locked clock pll_CCLK over line 330 which is coupled as inputs to a delay match circuit 340 and a clock gate and clock tree circuit 350. In addition, the PLL circuit includes a clock generator (not separately shown) that generates a double-frequency (2×) clock pll_CCLK, which is provided over line 360 to a skew compensation circuit 370 and delay circuits 380 and 390. Thus, if pll_CCLK has a frequency of 100 MHz or 133 MHz, respectively, pll_CCLK (2×) will have a frequency of 200 MHz or 266 MHz, respectively.

As shown in FIG. 1, the delay circuit 380 receives a conventional CAS_L signal from the memory controller 200, and delay circuits 390, which may be multiple circuits of substantially the same design as delay circuit 380, receive other conventional signals from the memory controller 200, such as RAS signals, chip select signals, etc., that are used in data transfer operations with the DIMMs 215. An embodiment of the invention will be described below using the CAS_L signal as an example, but it is equally applicable to any signal exchanged between the host bridge 120 (including any device of the host bridge, such as memory controller 200) and a memory module or other signal-receiving device.

The concepts of the invention, as will be seen, may be more broadly applied to any clock-driven devices that are controlled or coupled to a circuit that has a low-power mode, where it is desired that the clocking to the devices persist even during the low-power mode.

Figure 2:
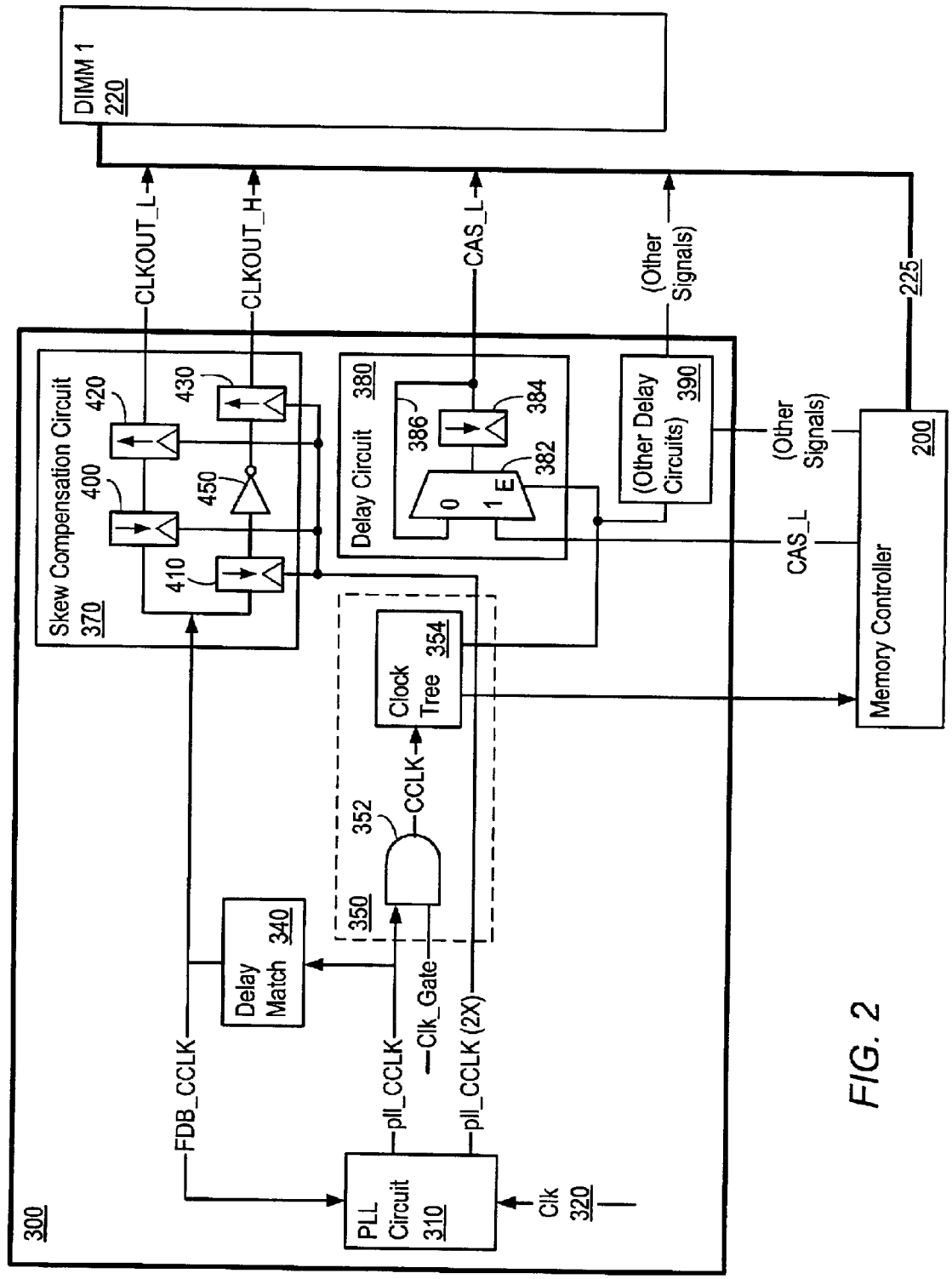
FIG. 2 illustrates circuitry suitable for implementing an embodiment of the invention.

FIG. 2 is a circuit diagram of a portion of the system of FIG. 1, showing additional detail, in particular with respect to the clock gate and clock tree circuit 350, the skew compensation circuit 370, and the delay circuit 380.

Under normal (i.e. active) operating conditions, the system 100 maintains a Clk_Gate signal active (i.e. set high), and this signal is input to an AND gate 352 of the circuit 350. The other input to gate 352 is the pll_CCLK signal, and thus the pll_CCLK signal is passed through to clock tree 354. The clock tree 354 may include conventional circuitry for distributing the pll_CCLK signal as needed, both as to timing and target components, to the circuits and other components forming part of or in communication with the host bridge 120.

In the active mode, the clock tree 354 drives the core clock signal to the memory controller 200, which in turn provides signals as necessary for memory operations, such as CAS_L and other signals, to the DIMMs 215. An example of a suitable delay circuit for such signals is shown as delay circuit 380 for the CAS_L signals, and includes a multiplexer (MUX) 382 having the CAS_L signals as one input (e.g. to line 1 of the MUX), and a feedback signal 386 as the other input (in this example, the line 0 input). An enable signal, namely the core clock signal CCLK, is provided by the gate 352.

A falling-edge driven gate 384 is coupled to the output of the MUX 382, and is clocked by the pll_CCLK (2×) signal from the PLL circuit 310. Using this arrangement of the delay circuit 380, when a CAS_L signal appears on line 1 of the MUX 382, it is passed by a rising edge of the core clock at the enable input of the MUX. Upon receiving a falling edge of the 2×clock, the CAS_L signal is then passed to the bus 225 and on to the target DIMM (selected in a conventional manner by a chip select signal), such as DIMM 220.

Since there are two clocks at the 2× rate for each clock of the pll_CCLK signal at the line 1 input to the MUX 382, another falling edge of the 2× clock at gate 384 will arrive before a new rising edge of the pll_CCLK arrives at MUX 382. In particular, the next falling edge of the pll_CCLK will select whatever appears at line 0 of the MUX 382, and that value will be clocked through as CAS_L by the succeeding falling edge of the 2× clock at the gate 384. Thus, the feedback signal 386 is provided to the line 0 input of the MUX 382, which ensures that the CAS_L value will be provided in full to the DIMM 220.

This delay circuit 380 thereby coordinates the CAS_L signal with the 2× clock signal. There may be a certain amount of skew in the CCLK signal among various components, and use of the 2× clock with gate 384 ensures that the CAS_L signal is aligned with the falling edges of the 2× clock signal when it is provided to the DIMM. The same signal deskewing is accomplished for any other desired signals provided to the DIMM 220.

When the system 100 determines (e.g. under software control) that it should to enter a low-power mode, the signal Clk_Gate is set low, i.e. made inactive, and thus inhibits the signal from passing through the gate 352, and the input to the clock tree 354 is low. As a result, the memory controller 200 (and other devices 192–198) no longer receive the clock signal CCLK from the clock tree 354, and it ceases to provide signals to the memory modules.

In conventional systems, the memory modules may be driven by a clock that is disabled when the system enters the low-power mode. For devices that do not need a constant clock, this is not a problem. However, devices and specifications are being developed that require a continued clock for optimal functioning, such as the DDR DIMM devices mentioned above. While it would be possible to power down such DIMMs in the low-power mode, and then restart them upon resumption of the active mode, the restarting procedure and synchronization (realignment) operation take a certain amount of time (e.g. 100 microseconds), which in general will be unacceptable for fast system operation. In addition, restarting components such as the DDR DIMMs without a proper reset (or self-refresh) procedure could result in erroneous values—such as erroneous RAS and CAS signals—being asserted. Although DDR DIMMs should have a self-refresh procedure, if they are registered DIMMs this can require continuous clocking to avoid these problems.

Accordingly, in the present invention the DDR DIMMs are provided with an uninterrupted clock signal. This is accomplished by using a feedback clock FDB_CCLK for the PLL circuit 310. Such a feedback clock is used by PLL circuits in any case, and thus the feedback clock may be tapped off as a bypass clock signal to a bypass circuit, namely the skew compensation circuit 370, which bypasses the clock gate 352 and clock tree 354, and is provided directly to the DIMMs.

In some systems, the PLL circuit may itself be powered down during the energy-saving mode. For such systems, the design of FIGS. 1–2 is still usable, with the exception that the continued clock signal, instead of being the PLL feedback clock signal, will be derived from a continually running clock. Other principles described herein will remain substantially the same.

Circuit 370 includes falling-edge driven input gates 400–410, rising-edge driven output gates 420–430, and an inverter 450. Gates 400 and 410 both receive the FDB_CCLK signal as an input, and are clocked by the pll_CCLK (2×) signal from the PLL circuit 310. Note that gates 400 and 410 could in principle be replaced by a single input gate, but two are provided in this embodiment for purposes of load and timing balance.

Figure 3:
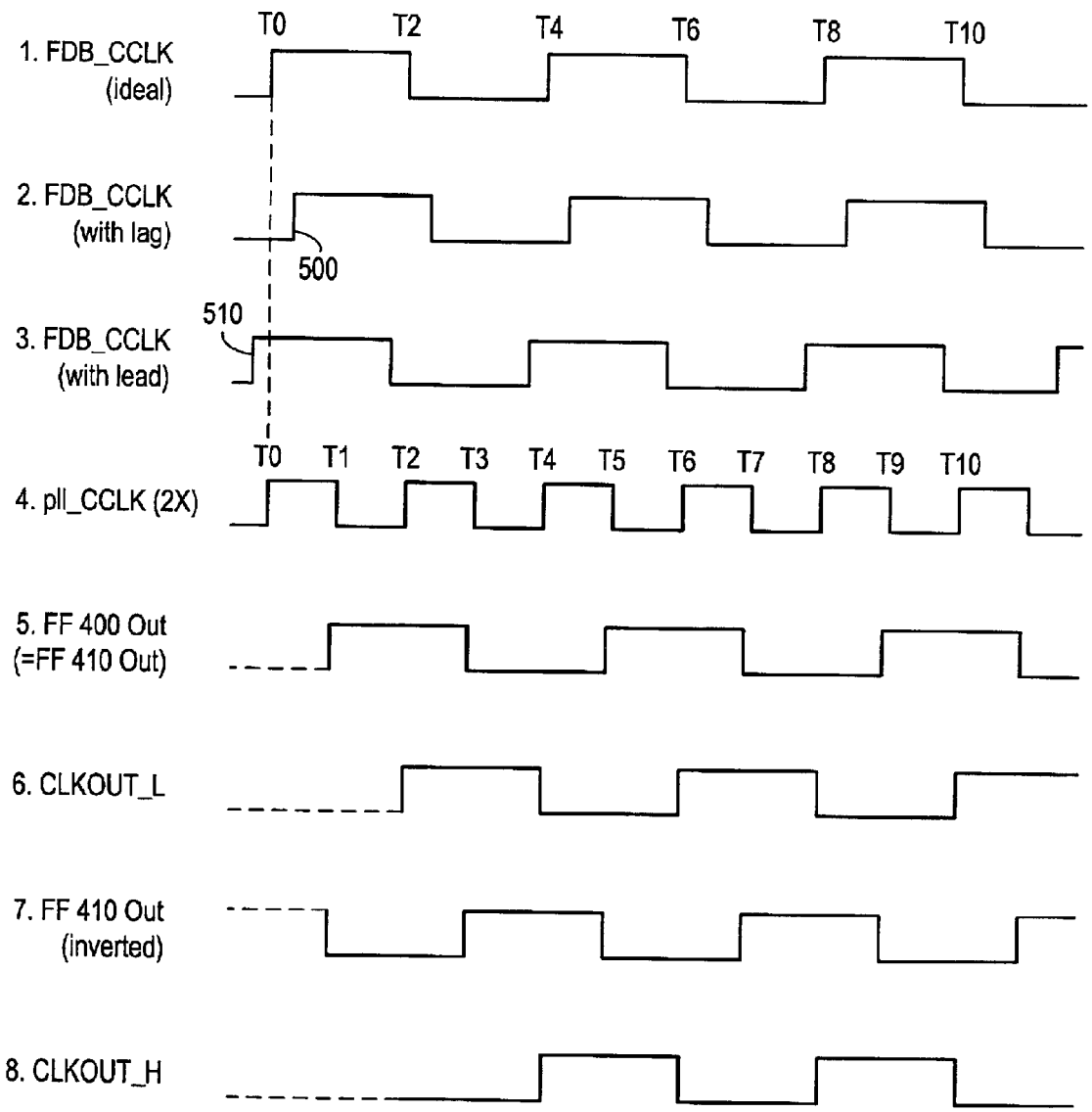
FIG. 3 is a timing diagram illustrating principles of operation of the diagrams of FIGS. 1 and 2.

FIG. 3 is a timing diagram illustrating the operation of the skew compensation circuit 370. Ideally, the feedback clock would arrive at the gates 400–410 in a synchronized manner with the 2× clock, as illustrated on lines 1 and 4 of FIG. 3. However, because of differences in routing, PVT variations, and so on, it is likely in an actual system that the feedback clock signal will lag (i.e. follow) the 2× clock signal by some amount (as in line 2 of FIG. 3), or will lead by a certain amount (see line 3). As will be seen, the use of the circuit 370 realigns the feedback clock with the 2× clock.

When the feedback clock signal reaches the gates 400–410, it is then clocked through by a negative edge of the 2× clock. Thus, in FIG. 3, whether the feedback clock leads or lags the pll_CCLK due to circuit-engendered skew, the next falling edge (at time T1) of the 2× clock (see line 4) will coincide with (in this example) a high value for FDB_CCLK.

Since the 2×clock runs at twice the rate of FDB_CCLK, a falling edge for the 2×clock will coincide with a high value for FDB_CCLK provided that FDB_CCLK skew is not more than ¼ of the clock period (for FDB_CCLK), i.e. ½ of a 2× clock period. If the skew is greater, then the falling edge at time T1 will occur before the rising edge 500 (in the case of a lagging FDB_CCLK), with the result that a low value for FDB_CCLK will be captured instead of a high value. Alternatively, if the FDB_CCLK signal leads the 2× clock by more than ¼ period (of FDB_CCLK), then the falling edge of the 2× clock that precedes the T1 falling edge would again capture a low signal for FDB_CCLK. In such a case, the CLKOUT_H and CLKOUT_L signals would not correctly capture the CAS_L and other signals to the memory modules.

The CLKOUT_L and CLKOUT_H signals are provided to minimize the likelihood of error in one signal causing erroneous signal or data capture. Thus, any error in a CLKOUT_H will be balanced and substantially eliminated by the inverse signal CLKOUT_L. Such a differential clock signal is provided in systems in use today.

Accordingly, as long as the skew is not greater than ¼ a FDB_CCLK period, then the pll_CCLK will resynchronize the signals passing through the skew compensation circuit 370 with the 2× clock.

The outputs of gate 400 and 410 are shown in line 5 of FIG. 3, and illustrate that the feedback clock has now been aligned with the falling edge of the pll_CCLK (2×). The output of gate 400 is passed to gate 420, and the output of gate 410 is first inverted by inverter 450 (see line 7) and then passed to gate 430.

At the next positive (rising) edge of the 2× clock, at time T2 on line 4, the outputs of the gate 400 and the inverter 450 are provided, respectively, as the inputs to the gates 420 and 430. Note that this arrangement presumes that any delay introduced by the inverter 450 is less than a ½ of a 2×-clock period, so that the output of the inverter appears before the succeeding rising edge of the 2× clock. In practice, inverters are very fast, and this is not a problem.

Placement of the inverter 450 after the gate 410 ensures that any skew introduced by the inverter does not add to the skew already present between the FDB_CCLK and 2× clock signals. Thus, these two signals are deskewed by gates 400–410 before the inversion takes place. Furthermore, placement of the inverter 450 before the gate 430 ensures that any skew introduced by the inverter will be eliminated by an additional deskewing action of gates 420 and 430. Thus, the use of the inverter 450 has no skewing effect on either the incoming or outgoing clock signals.

Thus, the rising edge at time T2 (see line 4) clocks the high value of FDB_CCLK (see line 5) into the gate 420, and this value is provided as CLKOUT_L (see line 6) to the memory bus 225. The same rising edge at time T2 clocks the low value of FDB_CCLK (see line 7) into the gate 420, and this value is provided as CLKOUT_H (see line 8) to the memory bus 225.

When the system is in an active mode (i.e. Clk_Gate is set), the CAS_L and other signals are thereby provided to the memory bus 225 in a manner that is synchronized to the 2× clock, and thus skew is substantially eliminated. When the system enters a low-power mode (i.e. Clk_Gate is low), the CLKOUT_L and CLKOUT_H signals continue to be provided to the memory bus 225 and any memory modules coupled to it, as desired for ideal operation of DDR DIMMs, in particular registered (buffered) DDR DIMMs.

The CLKOUT_L and CLKOUT_H signals may additionally be provided to any other components that a user or system designer may desire to continue running when a portion of the system is in an energy-saving mode.

This embodiment of the invention thus both provides continued clock signals to selected components and devices, and also deskews those signals relative to other signals and each other, both in active mode and low-power mode.

It is possible to implement the present invention without a deskewing circuit such as circuit 370. In such an embodiment, the skew discussed above, eliminated as illustrated in FIG. 3, would remain as the CLKOUT_L and CLKOUT_H (and CAS_L, etc.) signals are provided to the memory bus 225. In that case, care should be taken in the system design to minimize skew between the FDB_CCLK and the other signals in the system.

In either embodiment (with or without circuit 370), it is desirable to include the delay match circuit 340, which includes circuitry designed to delay the FDB_CCLK signal by an amount sufficient to substantially match any delay introduced to the CCLK signal by the gate 352 and/or the clock tree 354. Since the clock tree may include a large number of components (e.g. 50,000 flip-flops in current systems), the delay match circuit 340 is designed to carefully match the clock tree delay, and may in effect mirror the clock tree circuit, i.e. include a large portion of substantially identical circuit elements.

Even when circuit 370 is used, this design allows the skew between the clock signals to be minimized before entering the deskewing circuit, thus reducing the likelihood of erroneous clocking or other signals being passed to the bus 225.

Any circuit that provides signals to a continually clocked component, such as memory, I/O components, network components, etc. —and in the above exemplary embodiment, any circuit providing signals to the DIMMs 215—may be provided with a continuous clocking circuit as described above. Thus, the bus interface unit, PCI logic, etc. mentioned above could each be provided with such a continuous clocking circuit, as could components in subsystems other than the memory subsystem of the processor-based system.

What is claimed is:

1. A clock circuit coupled to a core clock signal of a processor-based system, including:
    a first subcircuit configured to selectively provide and inhibit passage of the core clock signal to a control circuit, and coupled to a receiving device configured to receive the core clock signal when it is passed by the first subcircuit; and
    a second subcircuit coupled to receive a continued clock signal based upon the core clock circuit and to pass the continued clock signal to the receiving device even when the first subcircuit inhibits passage of the core clock circuit to the control circuit.

2. The clock circuit of claim 1, wherein:
    the clock circuit is configured to receive a double-frequency clock signal derived from the core clock signal; and
    the second subcircuit further includes a skew compensation circuit configured to reduce skew between the continued clock signal and the core clock signal as passed by the first subcircuit.

3. The clock circuit of claim 2, wherein the second subcircuit includes a delay circuit coupled to receive the double-frequency clock signal and configured to output a signal from the control circuit with timing coordinated with the continued clock signal passed by the first subcircuit.

4. The clock circuit of claim 1, wherein:
    the receiving device includes a double-data rate memory module;
    the control circuit includes a memory controller; and
    the first subcircuit is configured to pass the continued clock signal as a differential clock signal to the double-data rate memory module to drive the memory module even when the memory controller does not receive the core clock signal.

5. A processor-based system configured to generate a system clock signal and having a microprocessor configured to execute instructions accessing a memory module, the system including:
    a host bridge coupled to the memory module and configured to pass control signals to the memory module;
    a phase-locked loop (PLL) circuit coupled to receive the system clock signal and to output a phase-locked core clock signal;
    a clock tree circuit configured to distribute the core clock signal to the host bridge;
    a first gate configured to receive the core clock signal, and to pass the core clock signal to the clock tree circuit when the system is in an active mode, and to inhibit passage of the core clock signal when the system is in a low-power mode; and
    a clock bypass circuit, configured to distribute the core clock signal to the memory module whether the system is in the active mode or the low-power mode.

6. The system of claim 5, wherein the core clock signal distributed by the clock bypass clock circuit comprises a feedback clock signal of the PLL circuit.

7. The system of claim 5, further including:
    a delay circuit coupled to receive the control signals from the host bridge and pass the received control signals to the memory module;
    wherein the PLL circuit is further configured to generate a double-frequency (2×) clock signal based upon the system clock signal, and to pass the 2× clock signal to the delay circuit and to the bypass circuit, the delay circuit and bypass circuit being configured to coordinating timing of the respective signals passing through them with the 2× clock signal.

8. The system of claim 7, wherein:
    the bypass circuit includes a skew compensation circuit configured to be clocked by the 2× clock.

9. The system of claim 8, wherein the skew compensation circuit includes at least one input gate configured to be clocked by a first edge of the 2× clock, having as an input a feedback core clock signal from the PLL circuit, and having as output a synchronized feedback core clock signal substantially aligned with the first edge of the 2× clock.

10. The system of claim 9, wherein the first edge of the 2× clock is a falling edge, and the skew compensation circuit further includes:
    a first output gate configured to be clocked by a rising edge of the 2× clock, having the synchronized feedback core clock signal as an input, and having as output a further synchronized core clock signal; and
    a second output gate configured to be clocked by the rising edge of the 2× clock, having an inverted form of the synchronized feedback core clock signal as input, and having as output an inverted form of the further synchronized core clock signal;
    wherein the further synchronized core clock signal and inverted further synchronized core clock signal are coupled to be provided as a differential clock signal to the memory module.

11. A method for substantially continuous clocking of a receiving device coupled to a processor-based system, including the steps of:
    providing a core clock signal to a host bridge having as outputs control signals coupled to the receiving device when the system is in an active mode;
    inhibiting passage of the core clock signal to the host bridge when the system is in a low-power mode; and
    providing a bypass clock signal to the receiving device both when the system is in the active mode and when the system is in the low-power mode.

12. The method of claim 11, wherein the step of providing the core clock signal includes passing the core clock signal through a phase-locked loop (PLL) circuit.

13. The method of claim 12, further including the step of generating a double-frequency (2×) clock signal by the PLL circuit, the 2× clock signal being based upon and having substantially double a frequency of the core clock signal.

14. The method of claim 13, further including the step of deskewing the bypass clock signal relative to the core clock signal passed to the host bridge.

15. The method of claim 14, wherein the deskewing step includes the steps of:
    clocking the bypass clock signal using a first edge of the 2×clock signal to generate an aligned form of the bypass clock signal by; and
    clocking the core clock signal passed to the host bridge using the first edge of the 2× clock signal, to generate a form of the core clock signal substantially coordinated with the aligned form of the bypass clock signal.

16. The method of claim 15, wherein the first edge of the 2× clock signal is a falling edge, and the step of clocking the bypass clock signal includes the steps of:
    passing the bypass clock signal through at least one input gate clocked by the first edge of the 2× clock signal;

passing the bypass clock signal as output from the input gate through a first output gate in a noninverted form, the first output gate being clocked by a rising edge of the 2× clock signal;

generating an inverted form of the bypass clock after output from the input gate; and passing the inverted form of the bypass clock signal through a second output gate, the second output gate being clocked by the rising edge of the 2× clock signal.

17. The method of claim 16, further including the step of providing both the noninverted and inverted forms of the bypass clock signal to the receiving device as a differential clock signal.

18. The method of claim 11, wherein the receiving device includes a memory module, the method further including the step of providing the bypass clock signal to the memory module as a differential clock signal.

19. The method of claim 11, further including the step of substantially synchronizing at least one of the control signals with the bypass clock signal when the system is in the active mode.

20. The method of claim 11, further including the step of reducing skew between the bypass clock signal and the core clock control signals.

21. The method of claim 20, wherein the step of reducing skew is carried out at least in part by passing the bypass clock signal through a delay-matching circuit configured to match delay introduced to the core clock signal as it is passed to the host bridge.

* * * * *